United States Patent [19]
Okada et al.

[11] Patent Number: 5,781,079
[45] Date of Patent: Jul. 14, 1998

[54] MAGNETOSTATIC WAVE DEVICE

[75] Inventors: Takekazu Okada; Satoru Shinmura; Fumio Kanaya, all of Nagaokakyo, Japan

[73] Assignee: Murata Manufacturing Co., Ltd., Japan

[21] Appl. No.: 559,446

[22] Filed: Nov. 15, 1995

[30] Foreign Application Priority Data

Nov. 17, 1994 [JP] Japan .................. 6-309995

[51] Int. Cl.$^6$ ............................ H01P 1/215
[52] U.S. Cl. ...................... 333/24.1; 333/202
[58] Field of Search .................. 333/1.1, 17.2, 333/24.1, 24.3, 161, 162, 204, 202

[56] References Cited

U.S. PATENT DOCUMENTS

| | | | |
|---|---|---|---|
| 3,286,201 | 11/1966 | Roberts, Jr. .................. | 333/1.1 |
| 3,310,759 | 3/1967 | Ogasawara .................. | 333/24.1 X |
| 3,634,785 | 1/1972 | Kameya .................. | 333/24.1 X |
| 4,276,522 | 6/1981 | Coerver .................. | 333/1.1 |
| 4,555,683 | 11/1985 | Sorger et al. .................. | 333/202 |
| 4,595,889 | 6/1986 | Stitzer et al. .................. | 333/17.2 |
| 4,782,312 | 11/1988 | Chang et al. .................. | 333/202 X |

OTHER PUBLICATIONS

European Search Report on European Patent Application No. EP-95-11 8072; Feb. 26, 1996.
J.D. Adam, "Analog Signal Processing with Microwave Magnetics," Proceedings of the I.E.E.E., vol. 76, No. 2, Feb., 1988, pp. 159-170, New York, N.Y.

*Primary Examiner*—Paul Gensler
*Attorney, Agent, or Firm*—Ostrolenk, Faber, Gerb & Soffen, LLP

[57] ABSTRACT

A compact, low-cost magnetostatic wave device which can serve as an S/N enhancer or a filter. The magnetostatic wave device includes a ferromagnetic base; at least one transducer having a portion arranged adjacent to one surface of the ferromagnetic base and another portion arranged adjacent to the other surface of the ferromagnetic base; an input terminal with one side connected to one end of the transducer and the other side grounded; and an output terminal with one side connected to the other end of the transducer and the other side grounded. The ferromagnetic base is preferably disk-shaped.

19 Claims, 12 Drawing Sheets

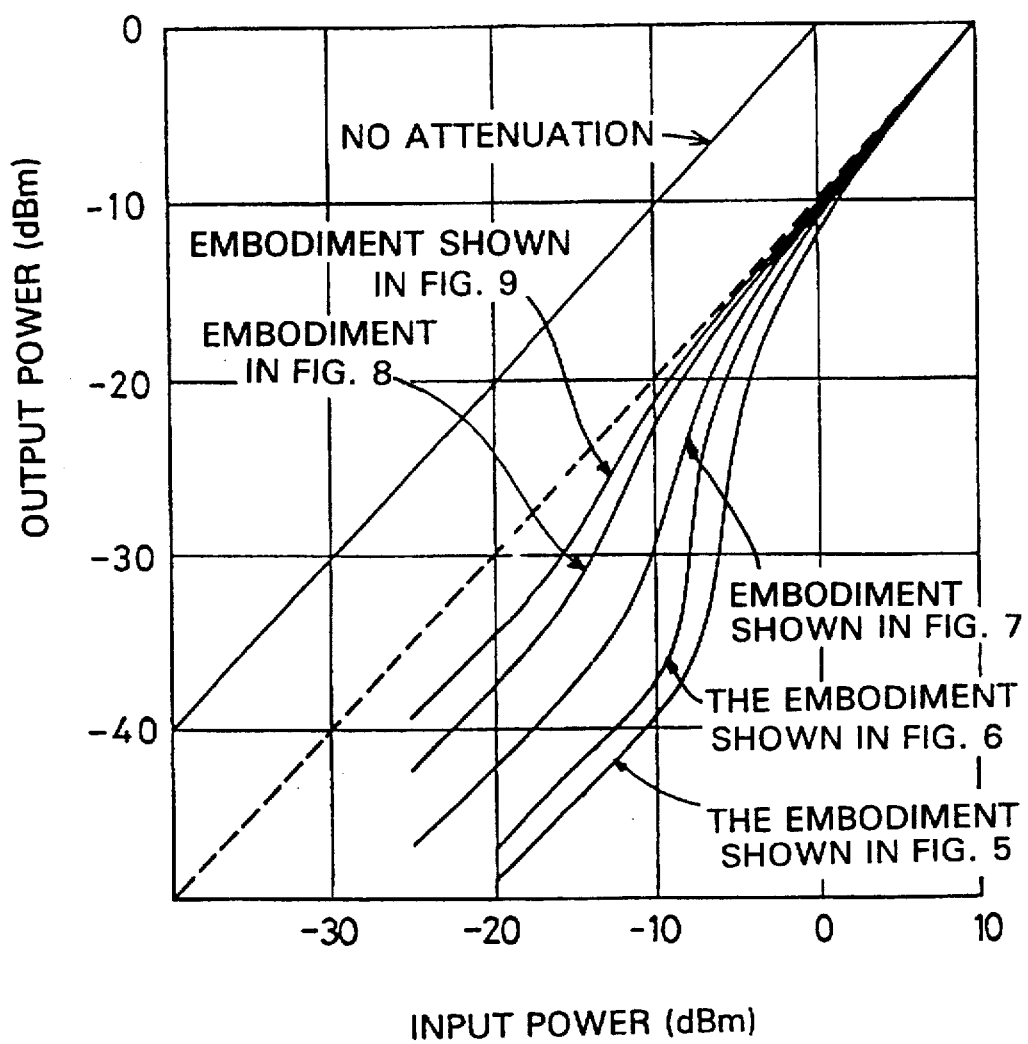

FIG. 18
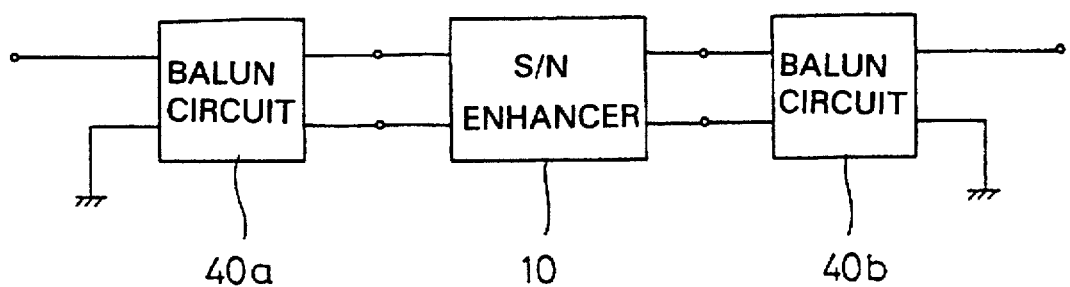
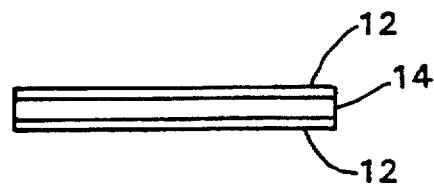
FIG. 19A
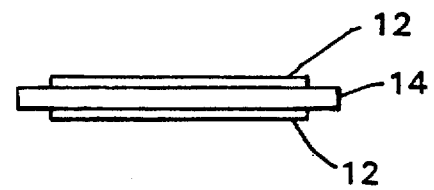
FIG. 19B

MAGNETOSTATIC WAVE DEVICE

BACKGROUND OF THE INVENTION

1. Field of the Invention

The present invention generally relates to a magnetostatic wave device. More specifically, the present invention relates to a magnetostatic wave device using a ferromagnetic base, for use as an S/N enhancer or a filter.

2. Description of the Related Art

One typical S/N enhancer which may constitute the background of the present invention is disclosed in, for instance, 1980 IEEE TRANSACTIONS ON MAGNETICS, Vol. MAG-16, pages 1168 to 1170, entitled "A BROAD-BAND MICROWAVE SIGNAL TO NOISE ENHANCER", and U.S. Pat. No. 4,283,692. FIG. 1 is a perspective view representing such a typical S/N enhancer.

The S/N enhancer 1 indicated in FIG. 1 includes a rectangular-plate-shaped YIG thin film 2 functioning as a ferromagnetic base. This YIG thin film 2 is fabricated on a bottom major surface of a rectangular-plate-shaped GGG substrate 3. A surface of the YIG thin film 2 is caused to adhere to a center portion of a top major surface of a rectangular-plate-shaped dielectric substrate 4. A straight-shaped microstrip line 5 functioning as a transducer is formed on a center portion of the top major surface of this dielectric substrate 4, along a width direction thereof, in such a manner that this microstrip line 5 intersects the YIG thin film 2.

A signal-carrying side of an input terminal (not shown) is connected to one end of the microstrip line 5, whereas a signal carrying side of an output terminal (not shown) is connected to the other end of this microstrip line 5. A ground electrode 6 is formed on the bottom major surface of the dielectric substrate 2. The input terminal and the output terminal also have respective ground sides, which are grounded.

In the S/N enhancer 1 shown in FIG. 1, DC magnetic field Ho is applied to the YIG thin film 2 functioning as the ferromagnetic base along the longitudinal direction of the microstrip line 5. Then, when RF (high frequency) power is supplied to the input terminal an RF magnetic field is produced around the microstrip line 5, so that a magnetostatic surface wave (MSSW), which is one of three modes of magnetostatic waves, is excited within the YIG thin film 2. When the RF power supplied to the input terminal is low, since a substantial portion of this RF power is converted into the magnetostatic wave, the output power derived from the output terminal becomes very low. On the other hand, when the RF power supplied to the input terminal is high, since the conversion from RF power into the magnetostatic wave is saturated, a substantial portion of the RF power is obtained from the output terminal via the microstrip line 5.

As a consequence, a noise component, whose input power is low, is not substantially outputted, but a substantial portion of a signal component, whose input power is high, may be outputted. Therefore, the signal-to-noise ratio can be increased. The frequency characteristics at −6 dBm and 10 dBm of this S/N enhancer 1 are indicated in FIG. 2, and the input/output characteristic thereof at 3.3 GHz is represented in FIG. 3.

In the S/N enhancer 1 shown in FIG. 1, the amount of noise attenuation is determined based upon the length "L" of the YIG thin film 2 functioning as the ferromagnetic base, which is located opposite to the portion of the microstrip line 5 functioning as the transducer. In this example, the length "L" is selected to be 2.1 cm.

In order to increase the amount of noise attenuation in the S/N enhancer 1, it is an effective measure to increase this length "L". However, this measure may cause a problem, in that the dimension of the high-cost ferromagnetic base, e.g., the YIG thin film, becomes large. In other words, when the YIG thin film 2 is made small so as to achieve a compact and low-cost S/N enhancer 1, the length "L" is short, and thus the noise attenuation amount is lowered.

Also, in the S/N enhancer 1 of FIG. 1, the converted magnetostatic wave is reflected on the microstrip line 5 from the edge portion of the YIG thin film, and then this reflected magnetostatic wave may be transformed into RF power by parts of the S/N enhancer 1 such as the microstrip line 5. Such a reflected magnetostatic wave may appear as ripple components of the amplitude and the phase within the transmission band of the S/N enhancer 1. As a consequence, various other measures must be taken so as to reduce reflections of the magnetostatic wave in this S/N enhancer 1.

For example, the length of the magnetostatic wave along the propagating direction, namely the width "W" of the YIG thin film 2, is increased, and further a magnetostatic wave absorbing member is provided at the edge portion of the YIG thin film 2.

SUMMARY OF THE INVENTION

The present invention has been made in an attempt to solve the above-described problems, and therefore, an object is to provide a compact magnetostatic wave device that can be manufactured at low cost.

To achieve this object, a magnetostatic wave device, according to one aspect of the present invention, has a ferromagnetic base; a transducer having a portion arranged at one surface of the ferromagnetic base and another portion arranged at the other surface of the ferromagnetic base; an input terminal with one side connected to one end of the transducer and the other side for being grounded; and an output terminal with one side connected to the other end of the transducer and the other side for being grounded.

In the above-described magnetostatic wave device, it is preferable to manufacture the ferromagnetic base in a disk shape.

When the ferromagnetic base is made in a disk shape, the converted magnetostatic wave is negligibly reflected on the transducer from the edge portion of the ferromagnetic base. As a consequence, the magnetostatic wave reflected from the edge portion of the ferromagnetic base is negligibly converted into RF power by parts of the magnetostatic wave device such as the transducer. Thus, the amplitude/phase ripple components are reduced within the transmission band of the magnetostatic wave device, and the resultant characteristics thereof can be improved. By making the ferromagnetic base in a disk shape, the characteristics of any of the embodiments of the invention can be improved.

According to another aspect of the present invention, the magnetostatic wave device preferably includes a second transducer having a portion arranged on one major surface of said ferromagnetic base and another portion arranged on the other major surface of said ferromagnetic base, and connected in parallel with said first-mentioned transducer between the input terminal and the output terminal. As a result, the impedance between the input terminal and the output terminal may be lowered and the insertion loss may be reduced.

In the magnetostatic wave devices disclosed herein, when a DC magnetic field is applied to the ferromagnetic base and also RF power is applied to the input terminal, an RF (high frequency) magnetic field is produced around the transducer, so that a magnetostatic wave is excited within the ferromagnetic base. When the RF power applied to the input terminal is low, this RF power is converted or transformed into the magnetostatic wave.

Since the transducer has one portion arranged at one major surface of the ferromagnetic base and another portion arranged at the other major surface of the ferromagnetic base, the conversion efficiency from the RF power into the magnetostatic wave is increased. Therefore, even when the dimension of the ferromagnetic base is made small, an amount of noise attenuation similar to the conventional noise attenuation amount can be obtained.

On the other hand, when the RF power applied to the input terminal is high, since the converting operation from the RF power into the magnetostatic wave is saturated, a major portion of this RF power may be derived from the output terminal through the transducer. As a consequence, in the magnetostatic wave devices, substantially none of a noise component having low input power is outputted, whereas a substantial amount of a signal component having high input power is outputted. In other words, the signal-to-noise (S/N) ratio of this magnetostatic wave device can be increased.

Thus, in accordance with the present invention, since the conversion efficiency from the RF power into the magnetostatic wave is improved, the compact magnetostatic wave device can be made at low cost.

A magnetostatic wave device, according to another aspect of the present invention, is comprised of: a ferromagnetic base; a first transducer having a portion arranged on a first surface of the ferromagnetic base and another portion arranged on the second surface of the ferromagnetic base; a second transducer having a portion arranged on the second major surface of the ferromagnetic base and another portion arranged on the first major surface of the ferromagnetic base; an input terminal with one side connected to one end of the first transducer and the other side connected to one end of the second transducer; and an output terminal with one side connected to the other end of the second transducer and the other side connected to the other end of the first transducer.

Since the first transducer has a portion arranged at a first major surface of the ferromagnetic base and another portion arranged at the second major surface of the ferromagnetic base, and the second transducer has a portion arranged at the second major surface of the ferromagnetic base and a portion at the first major surface of the ferromagnetic base, the conversion efficiency from the RF power into the magnetostatic wave is increased even more than in the previous embodiments.

Also, in this magnetostatic wave device, a condition is established such that the input terminal and the output terminal are connected to each other by the two transducers as in the case of connecting to each other by a feeder. Thus, even when the lengths of the transducers are made long in order to increase the noise attenuation amount, there is substantially no change in the impedance between the input terminal and the output terminal, and thus the insertion loss does not become large.

Other features and advantages of the present invention will become apparent from the following description of the invention which refers to the accompanying drawings.

BRIEF DESCRIPTION OF THE DRAWINGS

The above-described object and other objects, features and advantages of the present invention will become more apparent from the following detailed description of embodiments thereof, in conjunction with the accompanying drawings, in which:

FIG. 11 is a graphic representation showing input/output characteristics of the respective embodiments shown in FIG. 5 to FIG. 8 and the comparison example shown in FIG. 9;

FIG. 18 is a schematic block diagram showing an application example of the S/N enhancer indicated in FIG. 17; and FIGS. 19(A) and 19(B) are side views showing the YIG thin films 12 and the GGG substrate 14 according to modifications of the embodiment shown in FIG. 4, FIGS. 12–17 and FIGS. 5–8, respectively.

DETAILED DESCRIPTION OF EMBODIMENTS OF THE INVENTION

First Embodiment

Figure 1:
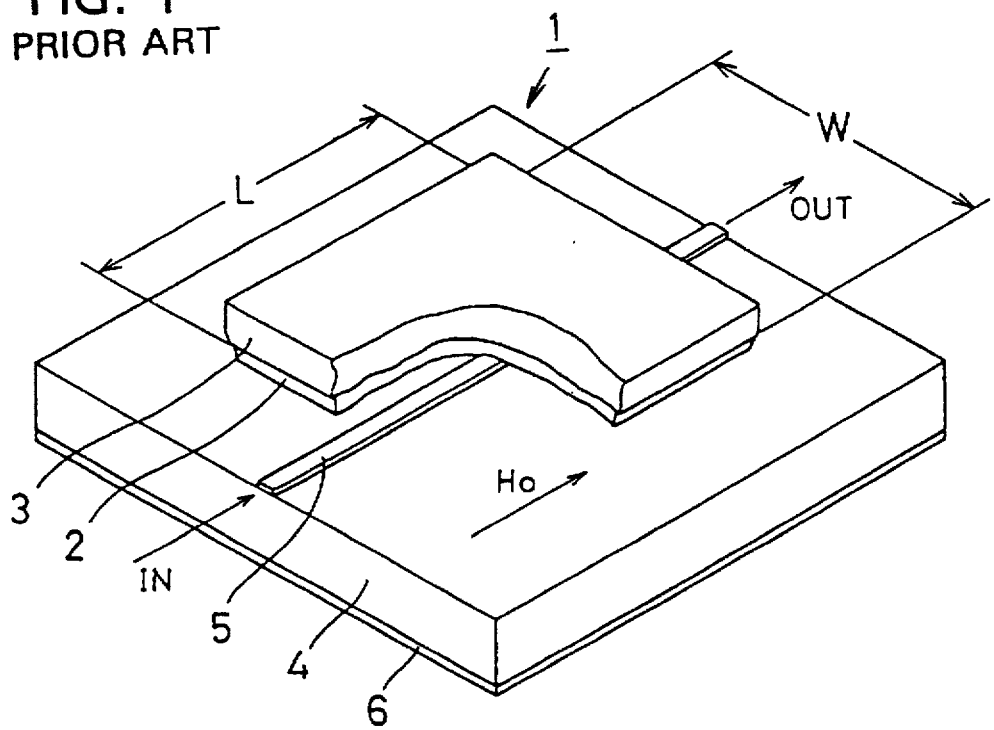
FIG. 1 is a perspective view showing one typical example of a conventional S/N enhancer.
Figure 4:
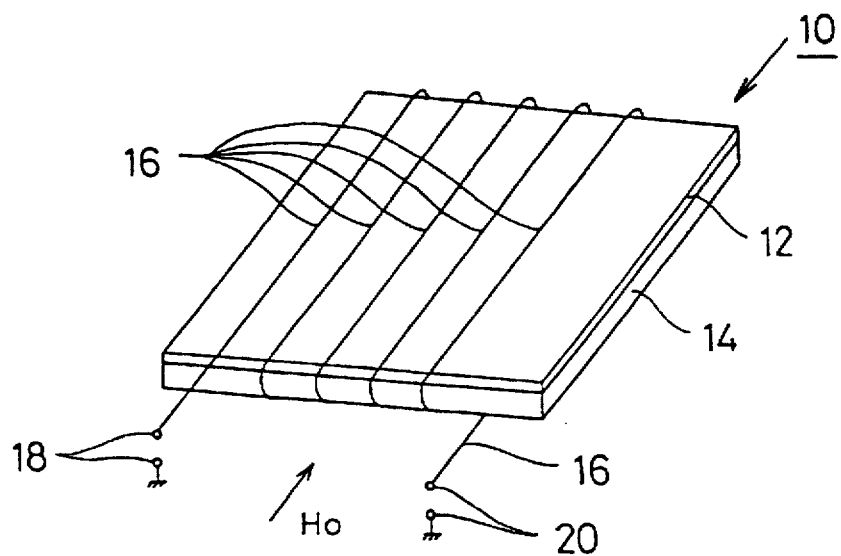
FIG. 4 is a perspective view showing an S/N enhancer according to a first embodiment of the present invention.
Figure 2:
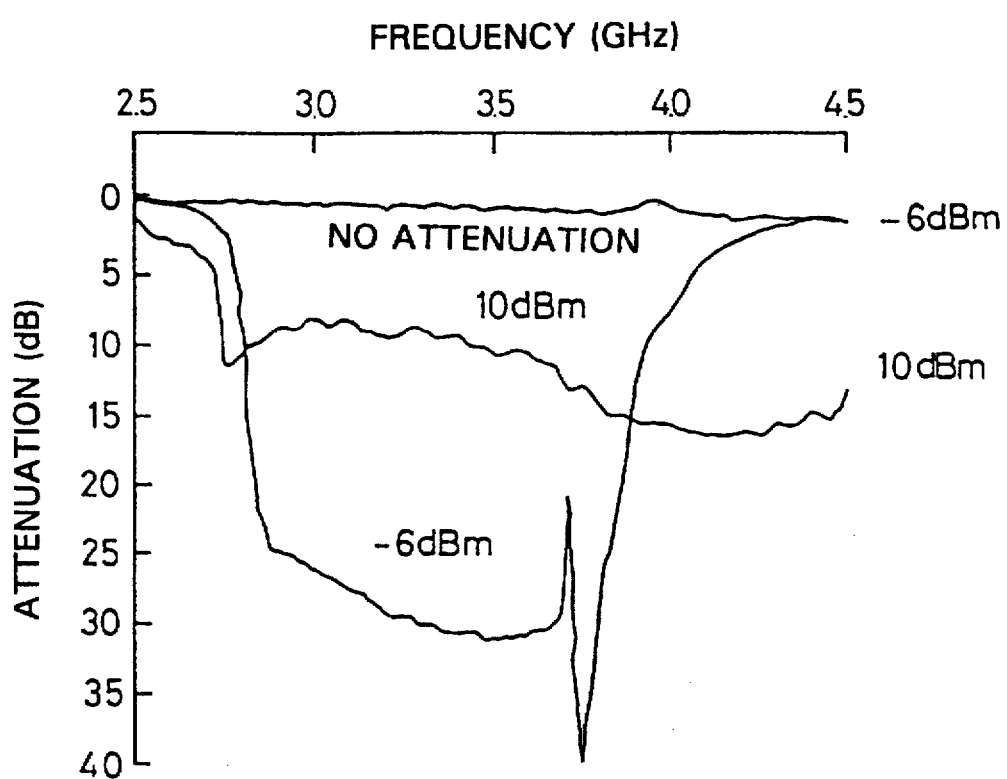
FIG. 2 is a graphic representation of the frequency characteristic of the conventional S/N enhancer shown in FIG. 1.
Figure 3:
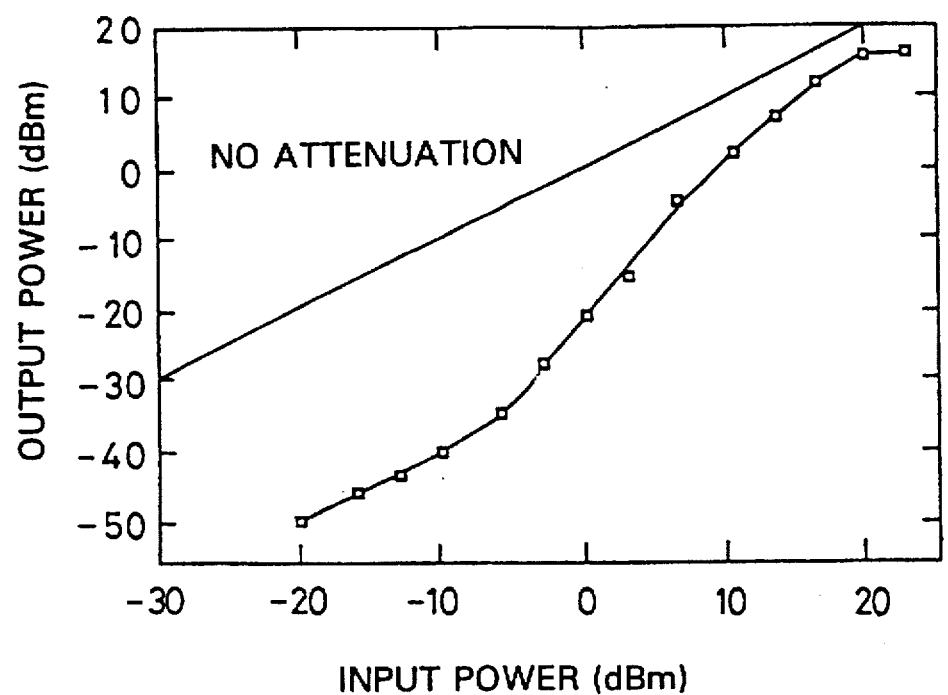
FIG. 3 is a graphic representation of the input/output characteristic of the conventional S/N enhancer shown in FIG. 1.

FIG. 4 is a perspective view showing an S/N enhancer 10, namely a magnetostatic wave device according to a first embodiment of the present invention. The S/N enhancer 10 includes a YIG thin film 12 having, for example, a rectangular plate shape, which functions as a ferromagnetic base. This YIG thin film 12 is formed on, for example, one major surface of a rectangular-plate-shaped GGG substrate 14. A transducer 16 made of, e.g., a conductive wire is wound around the YIG thin film 12 and the GGG substrate 14 by five turns. As a result, this transducer 16 has five portions arranged substantially parallel to a top major surface of the YIG thin film 12, and also five portions arranged substantially parallel to a bottom major surface of the YIG thin film 12. One side of an input terminal 18 is connected to one end of the transducer 16, and one side of an output terminal 20 is connected to the other end of the transducer 16. Furthermore, the other sides of both the input terminal 18 and the output terminal 20 are grounded.

In the S/N enhancer 10 shown in FIG. 4, a DC magnetic field "Ho" is applied to the YIG thin film 12 functioning as the ferromagnetic base along a direction parallel to the major surfaces of the YIG thin film 12 as well as parallel to the transducer 16. Then, when RF (or high frequency) power is applied to the input terminal 18, an RF (or high frequency) magnetic field is produced around the transducer 16, so that a magnetostatic surface wave is excited within the YIG thin film 12. When the RF power applied to the input terminal 18 is low, this RF power is converted or transformed into the magnetostatic wave. Since the transducer 16 has a portion arranged at the top major surface of the YIG thin film 12 and another portion arranged at the bottom major surface of the YIG thin film 12, the conversion efficiency from RF power into the magnetostatic wave is increased. Therefore, even when the dimension of the YIG thin film 12 is made small, an amount of noise attenuation similar to the conventional amount can be obtained.

On the other hand, when the RF power applied to the input terminal 18 is high, since the converting operation from RF power into the magnetostatic wave is saturated, a major portion of the input RF power may be derived from the output terminal 20 through the transducer 16.

As a consequence, in this S/N enhancer 10, substantially none of a noise component having low input power is outputted, whereas a substantial amount of a signal component, having high input power, is outputted. In other words, the signal-to-noise (S/N) ratio of an input signal can be increased by this S/N enhancer 10. Furthermore, since the conversion efficiency from the RF power into the magnetostatic wave is improved in this S/N enhancer 10, the resultant S/N enhancer 10 can be made compact and at a low cost.

Figure 5:
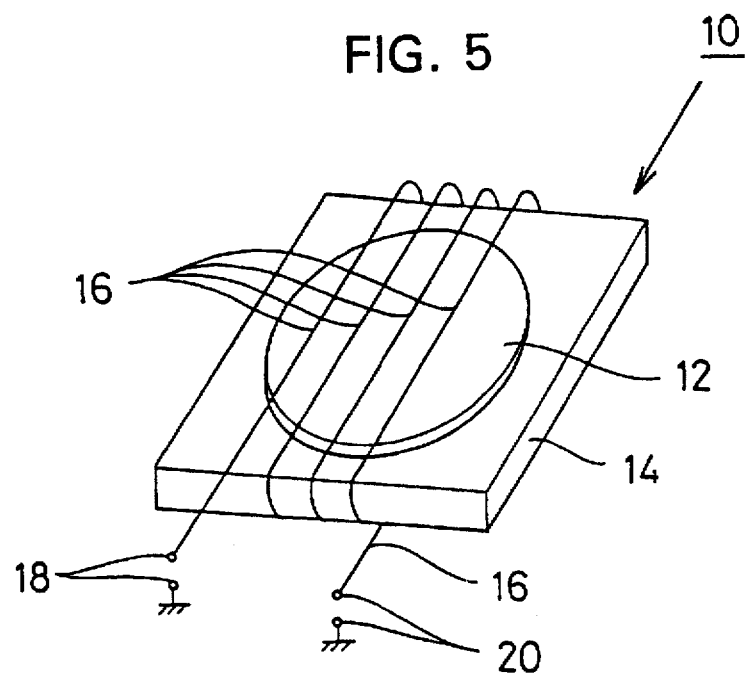
FIG. 5 is a perspective view showing an S/N enhancer according to a modification of the first embodiment.

FIG. 5 is a perspective view showing an S/N enhancer according to one modification of the S/N enhancer of FIG. 4. In the S/N enhancer of this modification, the YIG thin film 12 is fabricated in a disk shape on a center portion of the top major surface of the GGG substrate 14, and furthermore, the transducer 16 is wound around the YIG thin film 12 and the GGG substrate 14 by four turns, as compared with the above-described embodiment indicated in FIG. 4.

Figure 6:
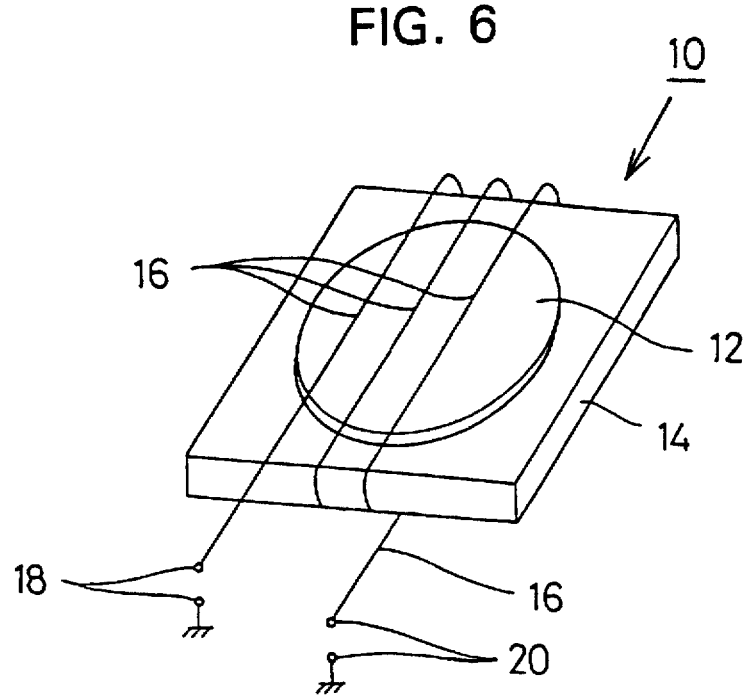
FIG. 6 is a perspective view showing an S/N enhancer according to another modification of the first embodiment.

FIG. 6 is a perspective view representing an S/N enhancer according to one modification of the S/N enhancer of FIG. 5. In the S/N enhancer of FIG. 6, the transducer 16 is wound around the YIG thin film 12 and the GGG substrate 14 by three turns, as compared with the above-described embodiment shown in FIG. 5.

Figure 7:
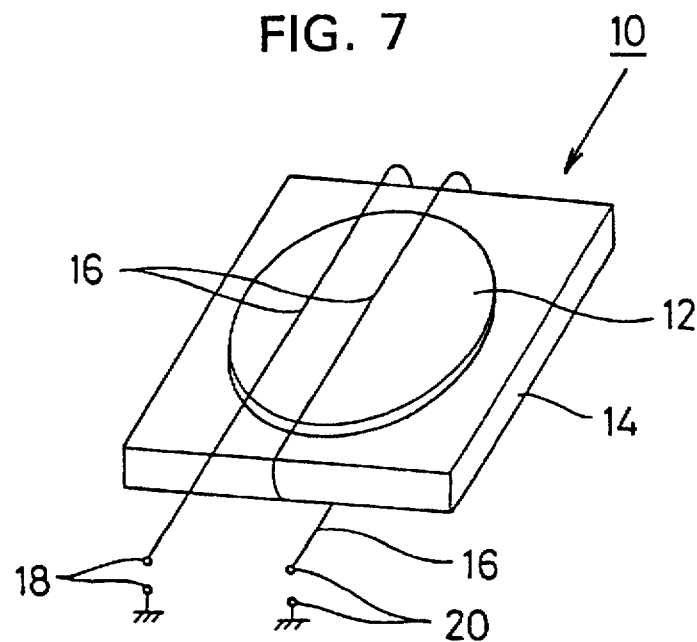
FIG. 7 is a perspective view showing an S/N enhancer according to a further modification of the first embodiment.

FIG. 7 is a perspective view showing an S/N enhancer according to another modification of the S/N enhancer of FIG. 5. In the S/N enhancer of FIG. 7, the transducer 16 is wound around the YIG thin film 12 and the GGG substrate 14 by two turns, as compared with the above-described embodiment shown in FIG. 5.

Figure 8:
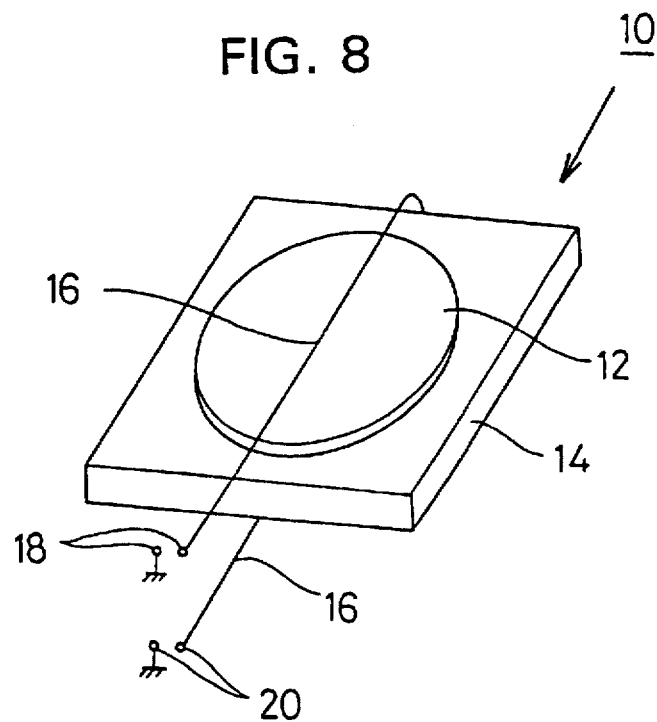
FIG. 8 is a perspective view showing an S/N enhancer according to a still further modification of the first embodiment.

FIG. 8 is a perspective view representing an S/N enhancer according to a further modification of the S/N enhancer of FIG. 5. In the S/N enhancer of FIG. 8, the transducer 16 is wound around the YIG thin film 12 and the GGG substrate 14 by one turn, as compared with the above-described embodiment shown in FIG. 5.

As in the embodiment of FIG. 4, in the respective modifications of FIG. 5 to FIG. 8, the transducer 16 has a portion arranged on the top major surface of the YIG thin film 12 and also a portion arranged on the bottom major surface of the YIG thin film 12. As a consequence, the conversion (transform) efficiency from the input RF power into the magnetostatic wave can be increased, and the S/N enhancers can be made compact, at low cost.

Moreover, in the respective modified S/N enhancers shown in FIG. 5 to FIG. 8, since the YIG thin film 12 is manufactured in a disk shape, the converted magnetostatic wave is negligibly reflected on the transducer from the edge portion of the YIG thin film 12. Therefore, the magnetostatic wave reflected from the edge portion of the YIG thin film 12 is negligibly transformed into RF power by parts of the magnetostatic wave device such as the transducer 16. As a consequence, the amplitude/phase ripple components are reduced within the transmission bands of the S/N enhancers, so that the characteristics thereof can be improved.

Figure 9:
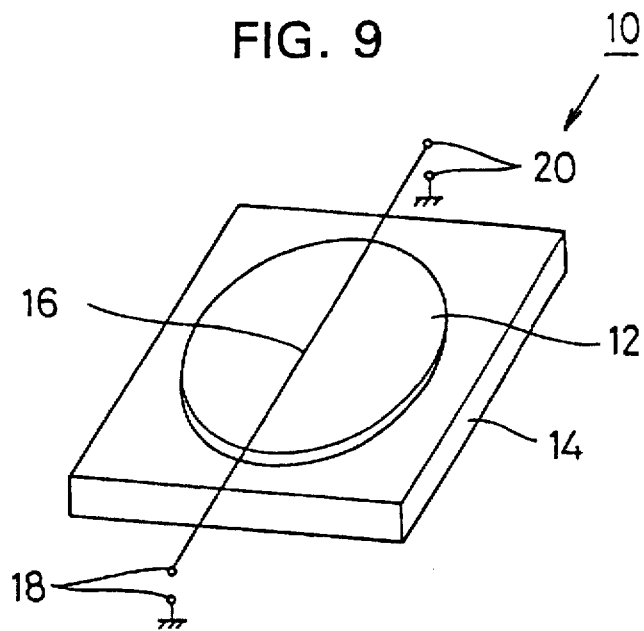
FIG. 9 is a perspective view representing a simplified example.

FIG. 9 is a perspective view representing a simplified example. In the S/N enhancer according to this simplified example of FIG. 9, a straight line shaped transducer 16 is arranged only on one major surface of the YIG thin film 12, as compared with the embodiment of FIG. 5.

Figure 10:
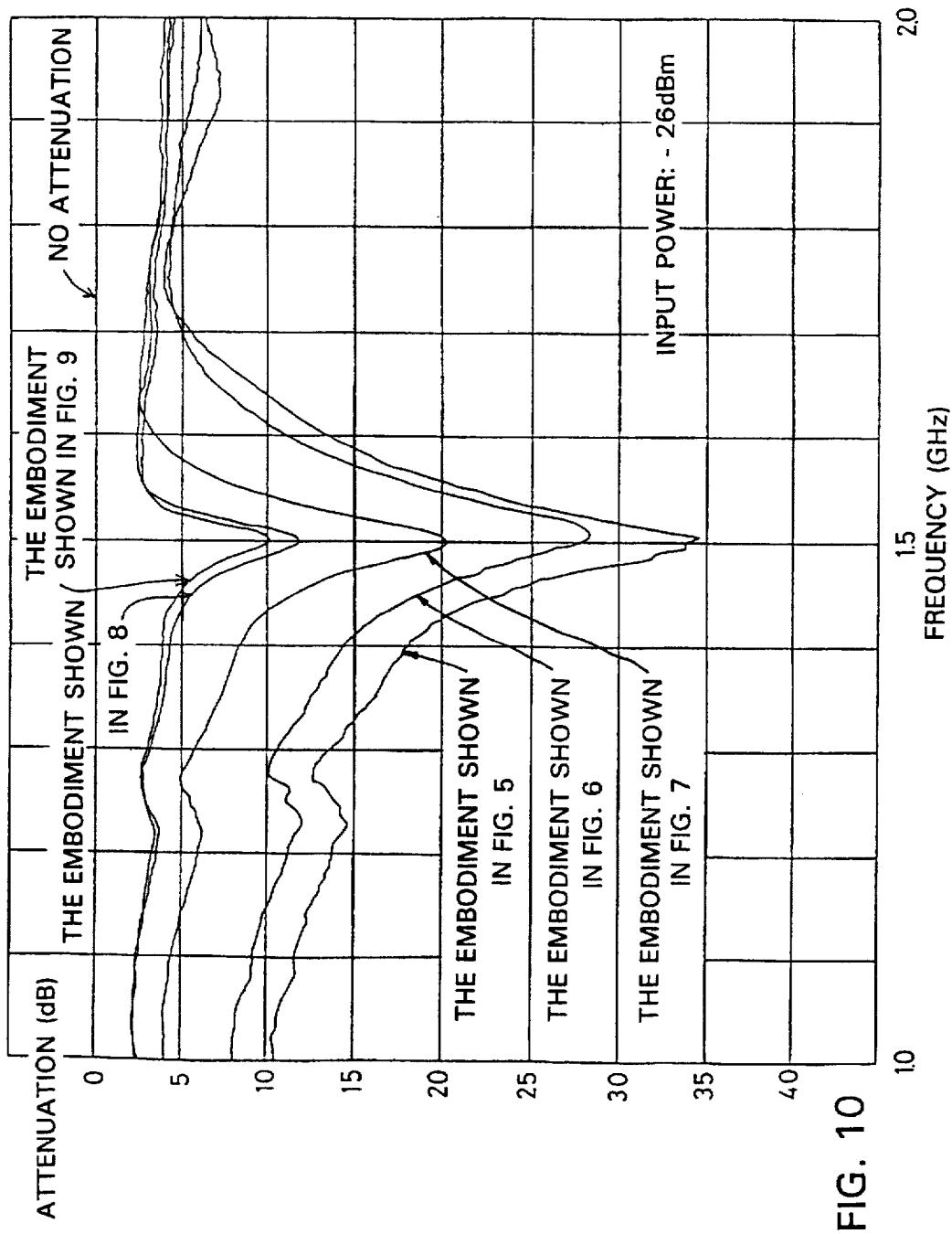
FIG. 10 is a graphic representation showing frequency characteristics of the respective embodiments shown in FIG. 5 to FIG. 8 and the comparison example shown in FIG. 9.

In FIG. 10, there are graphically represented frequency characteristics of the respective embodiments shown in FIG. 5 to FIG. 8, and of the simplified example indicated in FIG. 9. In FIG. 11, there are indicated input/output characteristics of the respective embodiments shown in FIG. 5 to FIG. 8, and of the simplified example denoted in FIG. 9. It should be noted that in this example, the thickness of the YIG thin film 12 is 95 μm, the diameter of this YIG thin film 12 is 2.2 mm, and the saturation magnetization 4 πMs of this YIG thin film 12 is 1,780 Gauss.

As apparent from the frequency characteristics shown in FIG. 10 and also from the input/output characteristics indicated in FIG. 11, when the number of turns of the transducer 16 is increased, the noise attenuation amount is increased. As a result, both the frequency characteristics and the input/output characteristics are improved. It should be understood that when the number of turns of the transducer 16 is increased, the impedance is also increased. Accordingly, the final number of turns of the transducer 16 may be properly selected, taking account of the desired noise attenuation amount and the impedance value.

Second Embodiment

Figure 12:
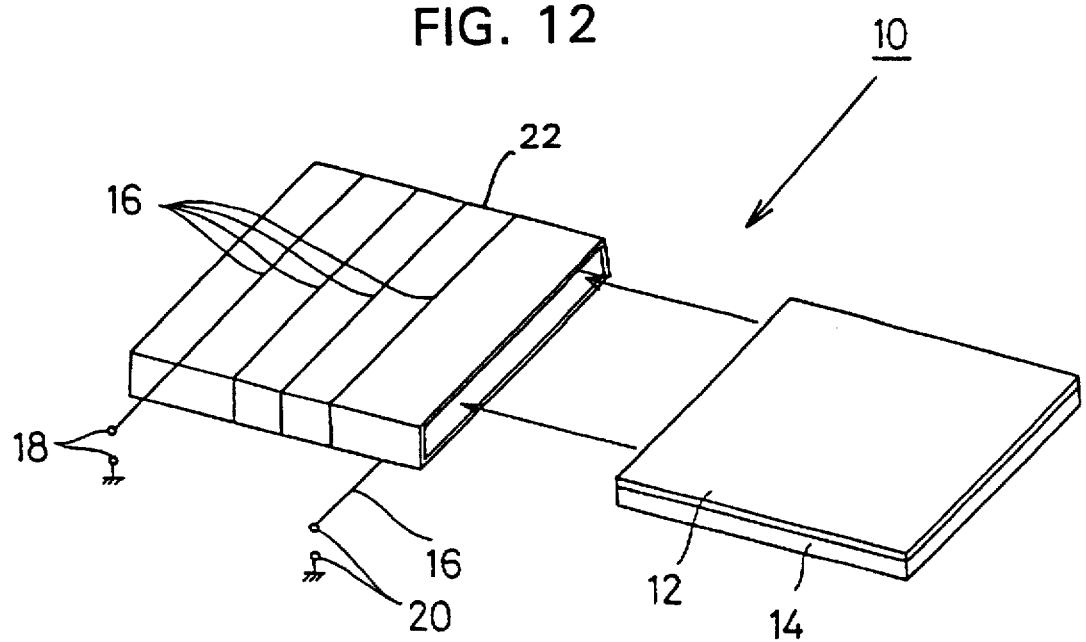
FIG. 12 is a fragmentary perspective view showing an S/N enhancer according to a second embodiment of the present invention.

FIG. 12 is a perspective view illustrating an S/N enhancer according to a second embodiment of the present invention. In this S/N enhancer shown in FIG. 12, both the YIG thin film 12 and the GGG substrate 14 are enclosed within a prism-shaped case 22 made of a non-magnetic material and having an insulating characteristic, and the transducer 16 made of conductive wire is wound around the case 22 by four turns.

In the embodiment shown in FIG. 12, the transducer 16 has a portion arranged at the top major surface of the YIG thin film 12 and also a portion arranged at the bottom major surface of the YIG thin film 12. As a consequence, the conversion (transform) efficiency from the input RF power into the magnetostatic wave can be increased, and the S/N enhancers can be made compact, at low cost.

Third Embodiment

Figure 13:
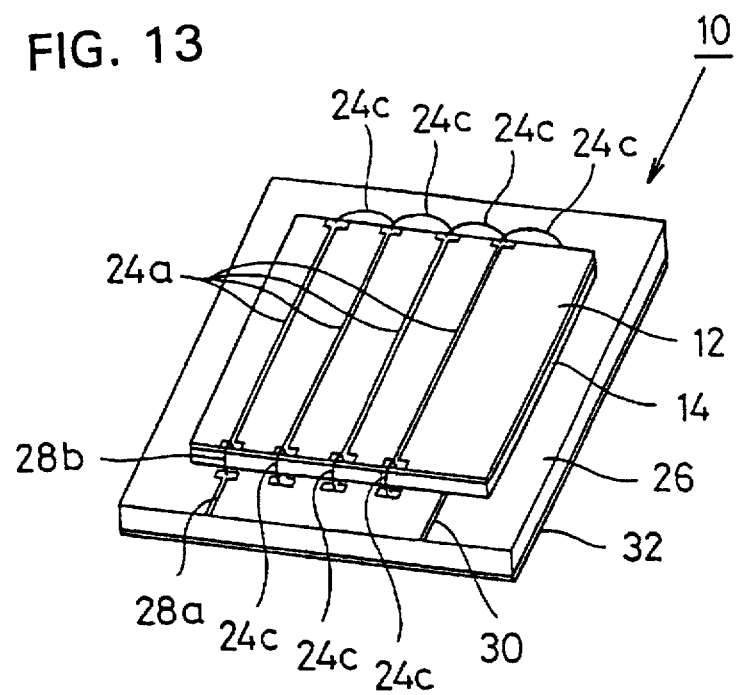
FIG. 13 is a perspective view showing an S/N enhancer according to a third embodiment of the present invention.
Figure 14:
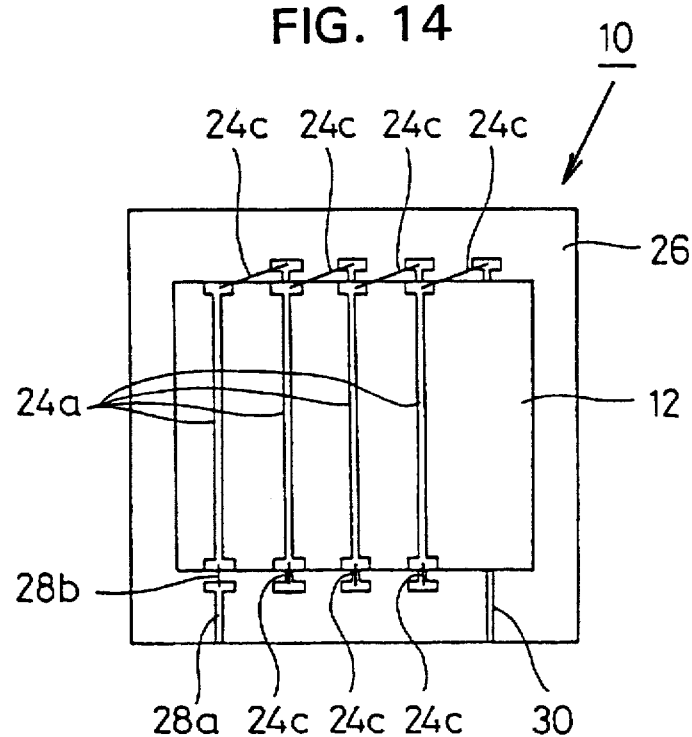
FIG. 14 is a plan view of the S/N enhancer of FIG. 13.
Figure 15:
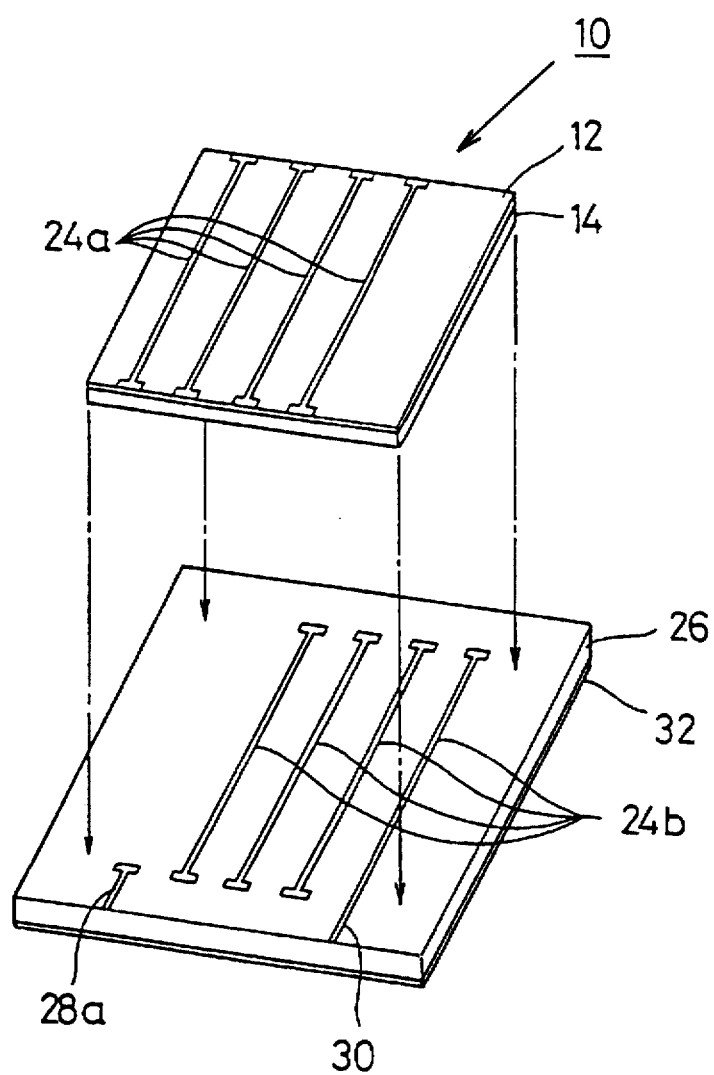
FIG. 15 is a fragmentary perspective view of a major portion of the S/N enhancer shown in FIG. 13.

FIG. 13 is a perspective view representing an S/N enhancer according to a third embodiment of the present invention. FIG. 14 is a plan view showing the S/N enhancer of FIG. 13, and FIG. 15 is a fragmentary perspective view showing a major portion of this S/N enhancer. In the embodiment shown in FIG. 13 to FIG. 15, in particular, four sets of straight line electrodes 24a are formed on the surface of the YIG thin film 12 in parallel to each other and separated by a preselected interval. The bottom surface of the GGG substrate 14 is caused to adhere to a center portion of a top major surface of a dielectric substrate 26. Also, four sets of straight line electrodes 24b are fabricated at the center portion of a top major surface of this dielectric substrate 26 in parallel to each other and separated by a preselected interval. Then, predetermined edge portions of these line electrodes 24a and 24b are connected to each other by conductive wires 24c, so as to form a coil-shaped transducer which is wound around the YIG thin film 12 and the GGG substrate 14 by four turns.

One end of the transducer, namely one end portion of one line electrode 24a, is connected to a terminal electrode 28a formed on the top major surface of the dielectric substrate 26 by a conductive wire 28b. This terminal electrode 28a is employed as one side of an input terminal. The other end of the transducer, namely one end portion 30 of one line electrode 24b, is extended to the edge portion of the dielectric substrate 26. This end portion 30 is employed as one side of an output terminal. Furthermore, an earth electrode 32 is formed on the bottom major surface of the dielectric substrate 26. This earth electrode 32 is utilized as the other side of both the input terminal and the output terminal.

In the respective embodiment of FIG. 13 to FIG. 15, the transducer has one portion arranged on one major surface of the YIG thin film 12 and another portion arranged on the other major surface of the YIG thin film 12. As a consequence, the conversion (transform) efficiency from the input RF power into the magnetostatic wave can be increased, and the S/N enhancer can be made compact, at low cost.

Fourth Embodiment

Figure 16:
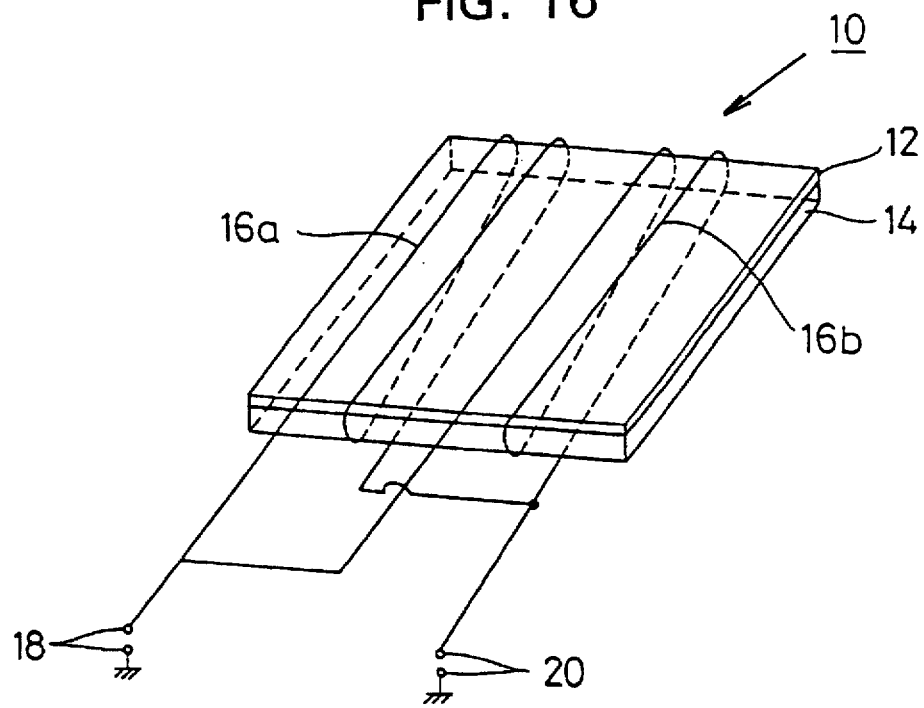
FIG. 16 is a perspective view showing an S/N enhancer according to a fourth embodiment of the present invention.

FIG. 16 is a perspective view showing an S/N enhancer according to a fourth embodiment of the present invention. In the embodiment of FIG. 16, a first transducer 16a made of a conductive wire is wound around a half portion of the YIG thin film 12 and the GGG substrate 14, respectively by two turns. Similarly, a second transducer 16b made of a conductive wire is wound two turns around the remaining half portion of the respective YIG thin film 12 and GGG substrate 14. Then, one end of the first transducer 16a and one end of the second transducer 16b are both connected to one side of the input terminal 18. The other ends of the first transducer 16a and the second transducer 16b are both connected to one side of the output terminal 20. The other sides of the input terminal 18 and the output terminal 20 are grounded.

In the embodiment shown in FIG. 16, the transducers 16a and 16b each have a portion arranged on one major surface of the YIG thin film 12 and also a portion arranged on the other major surface of the YIG thin film 12. As a consequence, the conversion (transform) efficiency from the input RF power into the magnetostatic wave can be increased, and the S/N enhancer can be made compact, at low cost.

Further, in the S/N enhancer of FIG. 16, since the transducers 16a and 16b are parallel-connected between the input terminal 18 and the output terminal 20, the impedance between the input terminal 18 and the output terminal 20 is reduced and thus the insertion loss is lowered.

Fifth Embodiment

Figure 17:
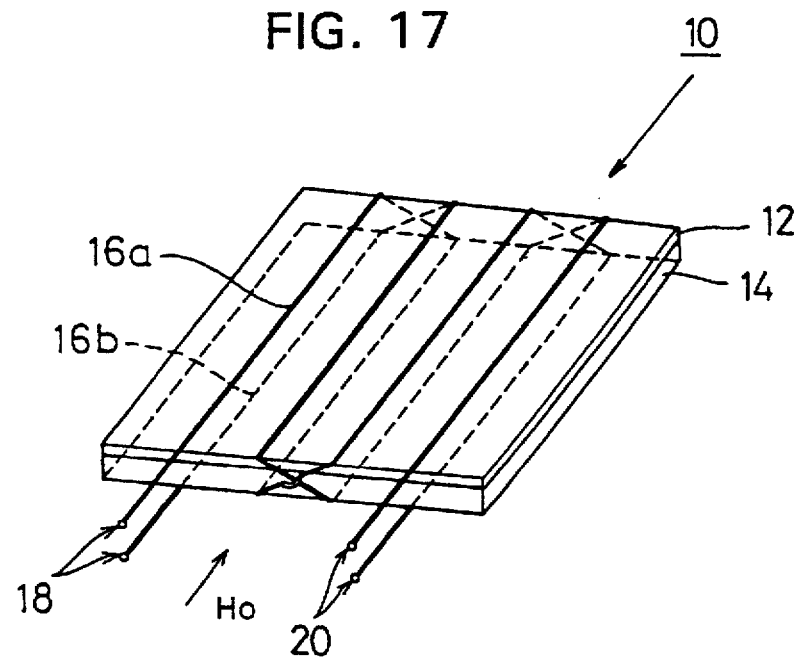
FIG. 17 is a perspective view showing an S/N enhancer according to a fifth embodiment of the present invention.

FIG. 17 is a perspective view showing an S/N enhancer according to a fifth embodiment of the present invention. In the embodiment of FIG. 17, a first transducer 16a made of a conductive wire is wound around the YIG thin film 12 and the GGG substrate 14 by two turns. Moreover, a second transducer 16b made of a conductive wire is wound around the YIG thin film 12 and the GGG substrate 14 by two turns in such a manner that each turn of the transducer 16b is located opposite a respective turn of the first-mentioned transducer 16a, thereby sandwiching the YIG thin film 12 and the GGG substrate 14.

Then, one end of the first transducer 16a and one end of the second transducer 16b are connected respectively to the two sides of the input terminal 18. The other ends of the first transducer 16a and the second transducer 16b are connected respectively to the two sides of the output terminal 20.

In the S/N enhancer 10 shown in FIG. 17, the DC magnetic field "Ho" is applied to the YIG thin film 12 functioning as the ferromagnetic base along a direction parallel to the major surface of the YIG thin film 12 as well as parallel to the transducers 16a and 16b. Then, when RF (or high frequency) power is supported to the input terminal 18, an RF (or high frequency) magnetic field is produced around the transducers 16a and 16b, so that a surface magnetostatic wave is excited within the YIG thin film 12.

When the applied RF power to the input terminal 18 is low, this RF power is converted or transformed into the magnetostatic wave. Since one transducer 16a has a portion arranged at the top major surface of the YIG thin film 12 and another portion arranged at the bottom major surface of the YIG thin film 12, and correspondingly, the other transducer 16b has a portion arranged at the bottom major surface of the YIG thin film 12 and another portion arranged at the top major surface of the YIG thin film 12, the conversion efficiency from the RF power into the magnetostatic wave is increased. Therefore, even when the dimension of the YIG thin film 12 is made small, a noise attenuation amount similar to the conventional noise attenuation amount can be obtained.

On the other hand, when the RF power inputted to the input terminal 18 is high, since the converting operation from RF power into the magnetostatic wave is saturated, a major portion of this RF power may be derived from the output terminal 20 through the transducers 16a and 16b. As a consequence, in this S/N enhancer 10 of FIG. 17, substantially none of the noise component, which has low input power, is outputted, whereas a substantial amount of the signal component, which has high input power, is outputted. In other words, the signal-to-noise (S/N) ratio of this S/N enhancer 10 can also be increased. Furthermore, since the conversion efficiency from RF power into the magnetostatic wave is improved in this S/N enhancer 10, the resultant S/N enhancer 10 can be made compact, at low cost.

Additionally, in the S/N enhancer 10 shown in FIG. 17, because of the above-described arrangement of the two parallel transducers 16a and 16b, a condition is established such that the input terminal 18 and the output terminal 20 are connected to each other by two connectors 16a and 16b, as in the case of connecting to each other by a feeder. Thus, even when the lengths of the transducers 16a and 16b are made long in order to increase the noise attenuation amount, there is substantially no change in the impedance between the input terminal 18 and the output terminal 20, and thus the insertion loss does not become large.

OTHER ASPECTS OF THE INVENTION

It should be noted that an impedance matching circuit may be employed as a prestage before the input side, and as a poststage following the output side, with each of the above-explained embodiments. With the S/N enhancer 10 shown in FIG. 17, the signal-to-noise ratio in a balanced transmission line can be improved. Also, when a balun (balanced converter) circuit 40a is provided as a prestage on the input side and another balun circuit 40b is employed as a poststage on the output side of the enhancer 10 of FIG. 17 as illustrated in FIG. 18, the signal-to-noise ratio in an unbalanced transmission line may also be improved.

Further, the signal-to-noise ratio of an unbalanced transmission line can be improved by using any of the other embodiments, not only the embodiment shown in FIG. 17. With the other embodiments, if the balun circuits 40a and 40b are provided before the input side and after the output side, in such a manner that an input and output of the balun circuits 40a and 40b are respectively connected in reverse order with respect to how they are connected in the embodiment shown in FIG. 17, then the signal-to-noise ratio in a balanced transmission line may also be improved.

Although only one YIG thin film 12 is formed on one major surface of the GGG substrate 14 in the respective embodiments of FIGS. 4 to 8 and FIGS. 12 to 17, two YIG thin films 12 may also be formed on two major surfaces of the GGG substrate 14 as shown in FIGS. 19(A) and 19(B).

Applying two YIG thin films 12 to these embodiments will achieve advantages similar to those of the embodiments in FIG. 4 to FIG. 8 and FIG. 12 to FIG. 17.

Although disk-shaped YIG thin films are only shown in the respective embodiments of FIG. 5 to FIG. 8, the YIG thin films functioning as the ferromagnetic base in the other embodiments may also be made in a disk shape. The disk shape in these embodiments will achieve similar advantages as in the embodiments in FIG. 5 to FIG. 8.

In the embodiment of FIG. 12, the transducer is formed around the case, which in turn surrounds the YIG thin film. Alternatively, the transducers may be fabricated around cases which surround the YIG thin film in the other embodiments as well.

Moreover, a portion of the transducer in the embodiment of FIG. 13 to FIG. 15 is formed by an electrode. At least a portion of each transducer may be formed by an electrode in the other embodiments as well.

The two transducers are connected between the input terminal and the output terminal in a parallel manner in the embodiment of FIG. 16. Alternatively, a plurality greater than two of the transducers may be parallel-connected between the input terminal and the output terminal.

In the above-described embodiments, the DC magnetic field is applied to the YIG thin film along a direction parallel to the major surface of the YIG thin film and also parallel to the transducer. As a result, a surface magnetostatic wave is excited in the thin film. Alternatively, the DC magnetic field may be applied to the YIG thin film along either a direction perpendicular to the major surface of the YIG thin film, or another direction parallel to the major surface of the YIG thin film and also perpendicular to the transducer. When the DC magnetic field is applied along the direction perpendicular to the major surface of the YIG thin film, a magnetostatic forward volume wave (MSFVW), which is another one of the three modes of magnetostatic waves, is excited in the YIG thin film. When the DC magnetic field is applied along the direction parallel to the major surface of the YIG thin film and also perpendicular to the transducer, a magnetostatic backward volume wave (MSBVW), which is still another of the three modes of magnetostatic waves, is excited in the YIG thin film.

Since the respective embodiments of the present invention are not only able to increase the S/N ratio of an RF signal, but also to function as a band-stop filter, these embodiments may be used as a band-stop filter as well.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A magnetostatic wave device comprising:

a ferromagnetic base comprising YIG and having two opposed major surfaces and being adapted for having a DC magnetic field applied thereto;

a first transducer having a portion arranged at a first major surface of said ferromagnetic base and another portion arranged at a second major surface of said ferromagnetic base;

an input terminal connected to one end of said first transducer; and an output terminal connected to the other end of said first transducer;

wherein said DC magnetic field is adapted to be applied along a direction parallel to said major surfaces of said ferromagnetic base and parallel to said transducer.

2. A magnetostatic wave device comprising:

a ferromagnetic base comprising YIG and having two opposed major surfaces and being adapted for having a DC magnetic field applied thereto;

a first transducer having a portion arranged at a first major surface of said ferromagnetic base and another portion arranged at a second major surface of said ferromagnetic base;

an input terminal connected to one end of said first transducer; and an output terminal connected to the other end of said first transducer;

wherein said ferromagnetic base comprises a YIG film on a substrate.

3. A magnetostatic wave device as claimed in claim 1 or claim 2 wherein said ferromagnetic base is disk-shaped.

4. A magnetostatic wave device as claimed in claim 3, further comprising:

a second transducer having a portion arranged at the first major surface of said ferromagnetic base and another portion arranged at the second major surface of said ferromagnetic base, said second transducer being connected in parallel to said first transducer.

5. A magnetostatic wave device as claimed in claim 1 or claim 2, further comprising:

a second transducer having a portion arranged at the first major surface of said ferromagnetic base and another portion arranged at the second major surface of said ferromagnetic base, said second transducer being connected in parallel to said first transducer.

6. A magnetostatic wave device as claimed in claim 1 or claim 2, wherein said transducer comprises a conductor having a plurality of turns which pass around said ferromagnetic base.

7. A magnetostatic wave device as claimed in claim 6, wherein said conductor is made of a continuous wire.

8. A magnetostatic wave device as claimed in claim 6, wherein said conductor is made of respective pluralities of electrodes formed adjacent to each of said first and second major surfaces, and wires interconnecting said electrodes.

9. A magnetostatic wave device as claimed in claim 1 or claim 2, wherein said transducer comprises a conductor having a plurality of turns which pass around a non-conductive material surrounding said ferromagnetic base.

10. A magnetostatic wave device as claimed in claim 1 or claim 2, wherein said transducer is connected to a first side of each of said terminals, and each said terminal has a second side for being grounded.

11. A magnetostatic wave device comprising:

a ferromagnetic base having two opposed major surfaces and being adapted for having a DC magnetic field applied thereto;

a first transducer having a portion arranged at a first major surface of said ferromagnetic base and another portion arranged at a second major surface of said ferromagnetic base;

an input terminal connected to one end of said first transducer;

an output terminal connected to the other end of said first transducer;

a second transducer having a portion arranged at said first major surface of said ferromagnetic base and another portion arranged at a second major surface of said ferromagnetic base;

said input terminal having a first side connected to one end of said first transducer and a second side connected to one end of said second transducer; and said output terminal having a first side connected to the other end of said first transducer and a second side connected to the other end of said second transducer.

12. A magnetostatic wave device as claimed in claim 11, wherein said ferromagnetic base is disk-shaped.

13. A magnetostatic wave device as claimed in claim 12, wherein said ferromagnetic base comprises YIG.

14. A magnetostatic wave device as claimed in claim 13, wherein said ferromagnetic base comprises a YIG film on a substrate.

15. A magnetostatic wave device as claimed in claim 11, wherein each said transducer comprises a conductor having a plurality of turns which pass around said ferromagnetic base, said first transducer having turns which are respectively opposed to corresponding turns of said second transducer through said ferromagnetic base.

16. A magnetostatic wave device as claimed in claim 15, wherein said ferromagnetic base comprises YIG.

17. A magnetostatic wave device as claimed in claim 16, wherein said ferromagnetic base comprises a YIG film on a substrate.

18. A magnetostatic wave device as claimed in claim 11, wherein said ferromagnetic base comprises YIG.

19. A magnetostatic wave device as claimed in claim 18, wherein said ferromagnetic base comprises a YIG film on a substrate.

* * * * *